United States Patent
Xin et al.

(10) Patent No.: US 9,984,649 B2
(45) Date of Patent: May 29, 2018

(54) ARRAY SUBSTRATE, DRIVING METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Yanxia Xin, Beijing (CN); Xiaofei Yang, Beijing (CN); Huiguang Yang, Beijing (CN); Xu Liu, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days. days.

(21) Appl. No.: 15/037,869

(22) PCT Filed: Nov. 6, 2015

(86) PCT No.: PCT/CN2015/093970
§ 371 (c)(1),
(2) Date: May 19, 2016

(87) PCT Pub. No.: WO2016/206278
PCT Pub. Date: Dec. 29, 2016

(65) Prior Publication Data
US 2017/0169791 A1    Jun. 15, 2017

(30) Foreign Application Priority Data
Jun. 24, 2015 (CN) .......................... 2015 1 0355348

(51) Int. Cl.
*G02F 1/136* (2006.01)
*G09G 5/00* (2006.01)
(Continued)

(52) U.S. Cl.
CPC ....... *G09G 5/003* (2013.01); *G02F 1/136213* (2013.01); *H01L 27/124* (2013.01);
(Continued)

(58) Field of Classification Search
CPC .......................... G02F 1/136213; G02F 1/1368
(Continued)

(56) References Cited

U.S. PATENT DOCUMENTS

2009/0273592 A1    11/2009    Chien et al.
2010/0245332 A1    9/2010    Hsu
(Continued)

FOREIGN PATENT DOCUMENTS

| CN | 101751841 A | 6/2010 |
| CN | 103728761 A | 4/2014 |

(Continued)

OTHER PUBLICATIONS

International Search Report and Written Opinion dated Mar. 23, 2016; PCT/CN2015/093970.

*Primary Examiner* — Abdul-Samad A Adediran
(74) *Attorney, Agent, or Firm* — Ladas & Parry LLP; Loren K. Thompson

(57) ABSTRACT

An array substrate, a driving method thereof and a display device are disclosed. In the array substrate, one second scanning signal line is disposed at a position corresponding to the 2N+1)th row of sub-pixels or the (2N+2)th row of sub-pixels, or one second scanning signal line is disposed at a position corresponding to the (N+1)th row of sub-pixels; each first switching element is disposed in a corresponding sub-pixel; each second switching element is disposed in a corresponding sub-pixel group; each first scanning signal line is configured to control a plurality of first switching elements in one row of sub-pixels; and each second scanning signal line is configured to control a plurality of second
(Continued)

switching elements in one row of sub-pixel groups. The display device can have resolution reduced by half or three fourth in the case of full screen display, and lowers drive power consumption of the display panel without affecting display brightness.

19 Claims, 11 Drawing Sheets

(51) Int. Cl.
    *H01L 27/12* (2006.01)
    *H01L 29/786* (2006.01)
    *G02F 1/1362* (2006.01)

(52) U.S. Cl.
    CPC .... *H01L 27/1222* (2013.01); *H01L 29/78675* (2013.01); *G09G 2300/0426* (2013.01); *G09G 2330/023* (2013.01)

(58) Field of Classification Search
    USPC .............................................. 257/72; 348/790
    See application file for complete search history.

(56) References Cited

U.S. PATENT DOCUMENTS

2011/0128455 A1* 6/2011 Tsubata ............. G02F 1/136213
    348/790
2015/0206903 A1* 7/2015 Gao ..................... G02F 1/1368
    257/72

FOREIGN PATENT DOCUMENTS

| CN | 103984136 A | 8/2014 |
|----|-------------|--------|
| CN | 104200786 A | 12/2014 |
| CN | 104900207 A | 9/2015 |

\* cited by examiner

ARRAY SUBSTRATE, DRIVING METHOD THEREOF AND DISPLAY DEVICE

TECHNICAL FIELD

At least one embodiment of the present disclosure relates to an array substrate, a driving method thereof and a display device.

BACKGROUND

Thin-film transistor liquid crystal displays (TFT-LCDs), as flat panel display devices, are more and more applied in high-performance display field due to the characteristics of small size, non-radiation, low manufacturing cost, etc.

A TFT-LCD panel generally comprises an array substrate and a color filter (CF) substrate which are cell-assembled together. A liquid crystal layer is disposed between the array substrate and the CF substrate.

SUMMARY

At least one embodiment of the present disclosure provides an array substrate, a driving method thereof and a display device, which reduce power consumption by reducing the number of scanning signal lines applied with signals or reducing the number of scanning signal lines and data signal lines applied with signals in the case of full display.

An embodiment of the present disclosure provided an array substrate, comprising: a base substrate and a plurality of data signal lines, a plurality of first scanning signal lines which are insulated from each other and intersected with the plurality of data signal lines, a plurality of second scanning signal lines which are insulated from each other and intersected with the plurality of data signal lines, a plurality of first switching elements, and a plurality of second switching elements, which are disposed on the base substrate; the plurality of data signal lines and the plurality of first scanning signal lines are intersected with each other to define a plurality of sub-pixels which are arranged in an array; each sub-pixel includes a pixel electrode; one second scanning signal line is disposed at a position corresponding to the (2N+1)th row of sub-pixels or the (2N+2)th row of sub-pixels, or one second scanning signal line is disposed at a position corresponding to the (N+1)th row of sub-pixels, in which N is an integer greater than or equal to zero; each first switching element is disposed in a corresponding sub-pixel and configured to control the on- and off-state of the corresponding sub-pixel; each second switching element is disposed in a corresponding sub-pixel group and configured to simultaneously control the on- and off-state of the sub-pixels in the corresponding sub-pixel group, and is connected with one data signal line, one second scanning signal line and a plurality of pixel electrodes in the sub-pixel group provided with the second switching element; each first scanning signal line is configured to control a plurality of first switching elements in one row of sub-pixels; and each second scanning signal line is configured to control a plurality of second switching elements in one row of sub-pixel groups.

For example, in the array substrate in an embodiment of the present disclosure, in a case where one second scanning signal line is disposed at the position corresponding to the (2N+1)th row of sub-pixels or the (2N+2)th row of sub-pixels, one sub-pixel group includes two sub-pixels which respectively belong to the (M+1)th column and are disposed in the (2N+1)th row and the (2N+2)th row of sub-pixels or four sub-pixels which respectively belong to the (2M+1)th column and the (2M+2)th column and are disposed in the (2N+1)th row and the (2N+2)th row of sub-pixels, in which M is an integer greater than or equal to zero.

For example, in the array substrate in an embodiment of the present disclosure, each first switching element includes one first thin-film transistor (TFT); and each second switching element includes one or more second TFTs.

For example, in the array substrate in an embodiment of the present disclosure, as for each sub-pixel group, in each column of sub-pixels, one second TFT is disposed in the (2N+1)th row of sub-pixels or the (2N+2)th row of sub-pixels; the second TFT includes a first drain electrode and a second drain electrode which are spaced from each other and respectively connected with the pixel electrode of the (2N+1)th row of sub-pixels and the pixel electrode of the (2N+2)th row of sub-pixels; a source electrode of the second TFT is connected with one of the data signal lines; and a gate electrode of the second TFT is connected with the second scanning signal line which is disposed at the position corresponding to the (2N+1)th row of sub-pixels or the (2N+2)th row of sub-pixels.

For example, in the array substrate in an embodiment of the present disclosure, the pixel electrode of the (2N+1)th row of sub-pixels or the pixel electrode of the (2N+2)th row of sub-pixels is provided with a connecting portion which is connected with the second TFT or provided with a connecting electrode which is configured to connect the second TFT and the pixel electrode of the (2N+1)th row of sub-pixels or the (2N+2)th row of sub-pixels.

For example, in the array substrate in an embodiment of the present disclosure, as for each sub-pixel group, in each column of sub-pixels, two second TFTs are disposed in the (2N+1)th row of sub-pixels or the (2N+2)th row of sub-pixels; both gate electrodes of the two second TFTs are connected with the second scanning signal line which is disposed at the position corresponding to the (2N+1)th row of sub-pixels or the (2N+2)th row of sub-pixels; both source electrodes of the two second TFTs are connected with the same data signal line; and drain electrodes of the two second TFTs are respectively connected with the pixel electrode of the (2N+1)th row of sub-pixels and the pixel electrode of the (2N+2)th row of sub-pixels.

For example, in the array substrate in an embodiment of the present disclosure, in each sub-pixel group, the pixel electrode away from the second scanning signal line is provided with a connecting portion which is connected with the second TFT, or provided with a connecting electrode which is configured to connect one of the second TFTs and the pixel electrode away from the second scanning signal line.

For example, in the array substrate in an embodiment of the present disclosure, as for each sub-pixel group, in each column of sub-pixels, the plurality of second TFTs which are configured to simultaneously control the on- and off-state of the sub-pixels in the (2N+1)th row of sub-pixels and the (2N+2)th row of sub-pixels are provided with the same gate electrode.

For example, in the array substrate in an embodiment of the present disclosure, in each sub-pixel group, source electrodes of a plurality of second TFTs in each column of sub-pixels are all connected with the data signal line for defining the column of sub-pixels on a same side.

For example, in the array substrate in an embodiment of the present disclosure, in each sub-pixel group, source electrodes of the second TFTs in the (2M+1)th column and the (2M+2)th column of sub-pixels are all connected with the data signal line disposed between the two columns of sub-pixels.

For example, in the array substrate in an embodiment of the present disclosure, in a case where one second scanning signal line is disposed at the position corresponding to the (2N+1)th row of sub-pixels or the (2N+2)th row of sub-pixels, a projection of the second scanning signal line on the base substrate is disposed at a position between projections of the pixel electrode of the (2N+1)th row of sub-pixels and the pixel electrode of the (2N+2)th row of sub-pixels on the base substrate.

For example, in the array substrate in an embodiment of the present disclosure, in a case where one second scanning signal line is disposed at a position corresponding to the (N+1)th row of sub-pixels, one sub-pixel group includes two sub-pixels which respectively belong to the (N+1)th row and are disposed in the (2M+1)th column and the (2M+2)th column of sub-pixels, in which M is an integer greater than or equal to zero.

For example, in the array substrate in an embodiment of the present disclosure, each first switching element includes one first TFT; and each second switching element includes one or more second TFTs.

For example, in the array substrate in an embodiment of the present disclosure, in each sub-pixel group, one second TFT is disposed in the (2M+1)th column of sub-pixels or the (2M+2)th column of sub-pixels; the second TFT includes a first drain electrode and a second drain electrode which are spaced form each other and respectively connected with the pixel electrode of the sub-pixel in the (2M+1)th column of sub-pixels and the pixel electrode of the (2M+2)th column of sub-pixels; a source electrode of the second TFT is connected with the data signal line between the (2M+1)th column of sub-pixels and the (2M+2)th column of sub-pixels; and a gate electrode of the second TFT is connected with the second scanning signal which is disposed at the position corresponding to the (N+1)th row of sub-pixels.

For example, in the array substrate in an embodiment of the present disclosure, the first drain electrode is connected with the pixel electrode of the sub-pixel in the (2M+1) th column of sub-pixels; the second drain electrode is connected with a connecting electrode which is connected with a connecting line; and the connecting line is connected with the (2M+2)th column of sub-pixels.

For example, in the array substrate in an embodiment of the present disclosure, the first TFT is an N-type TFT or a P-type TFT; and the second TFT is an N-type TFT or a P-type TFT.

For example, in the array substrate in an embodiment of the present disclosure, the pixel electrode of each sub-pixel is connected with the first scanning signal line and the data signal line through one first TFT.

At least an embodiment of the present disclosure provides a method for driving any of the array substrates, comprising: in a first mode, applying scanning-on-signals over the first scanning signal lines and applying scanning-off-signals over the second scanning signal lines; and in a second mode, applying scanning-off-signals over the first scanning signal lines, applying scanning-on-signals over the second scanning signal lines, and applying data signals over the data signal lines connected with the second switching elements.

For example, in the method for driving the array substrate provided by an embodiment of the present disclosure, in a case where the first TFT is an N-type TFT and the second TFT is a P-type TFT, in the first mode, high-level signals are applied to the first scanning signal lines; and in the second mode, low-level signals are applied to the second scanning signal lines.

An embodiment of the present disclosure provides a display device, comprising any of the array substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

Figure 1:
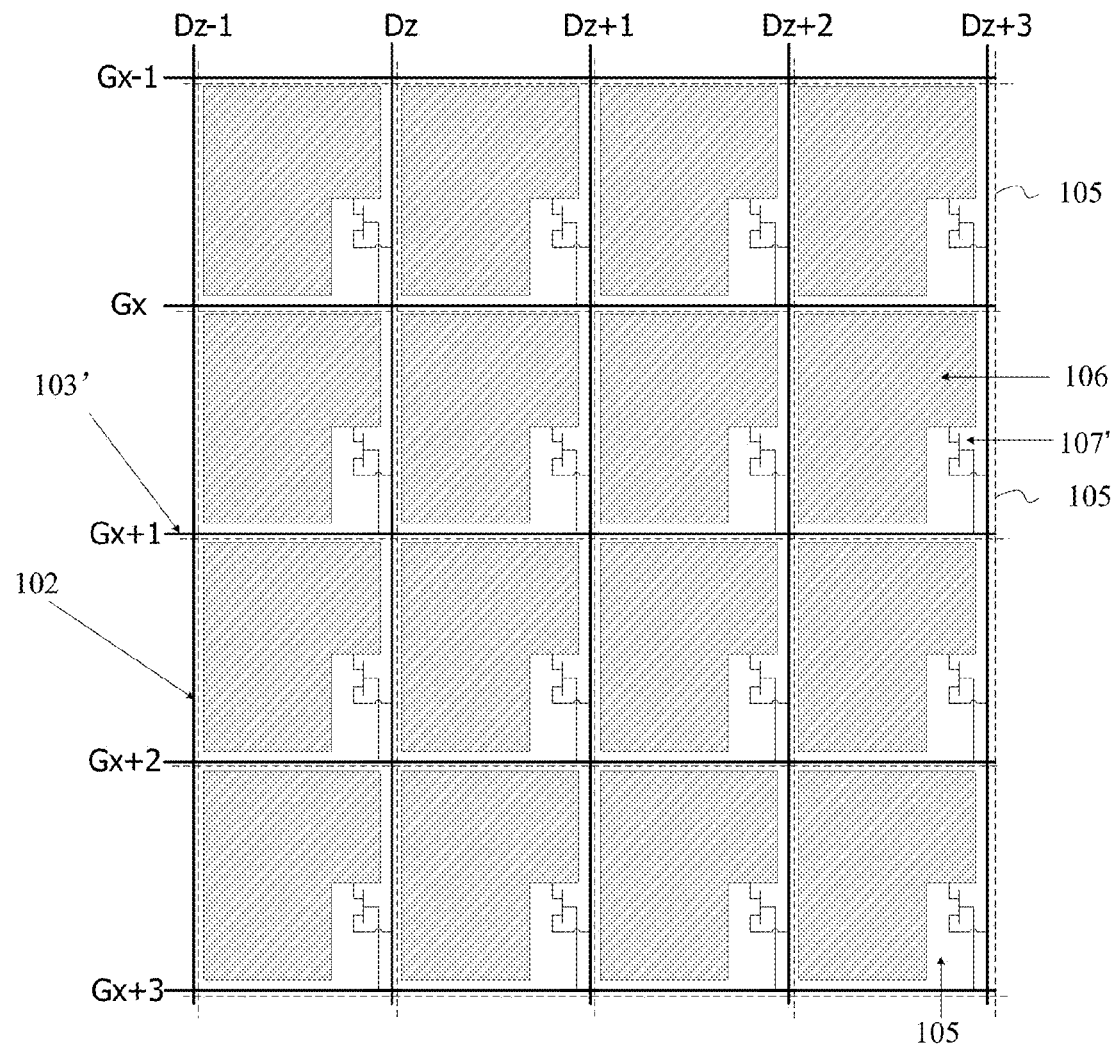
FIG. 1 is a schematic diagram of sub-pixels of a display panel.

Reference Numerals: 10—array substrate; 101—base substrate; 102—data signal line; 103'—scanning signal line; 103—first scanning signal line; 104—second scanning signal line; 105—one sub-pixel; 106—pixel electrode; 1061—connecting electrode or connecting portion of pixel electrode; 107'—switching element; 107—first switching element; 117—first TFT; 1171—drain electrode of first TFT; 1172—source electrode of first TFT; 1173—gate electrode of first TFT; 1174—active layer of first TFT; 108—second switching element; 118—second TFT; 1181—drain electrode of second TFT; 11811—first drain electrode of second TFT; 11812—second drain electrode of second TFT; 1182—source electrode of second TFT; 1183—gate electrode of second TFT; 1184—active layer of second TFT; 109—one sub-pixel group; 111—connecting line; 123—buffer layer; 124—first insulating layer; 125—second insulating layer; 126—planarization layer; 127—passivation layer.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 2:
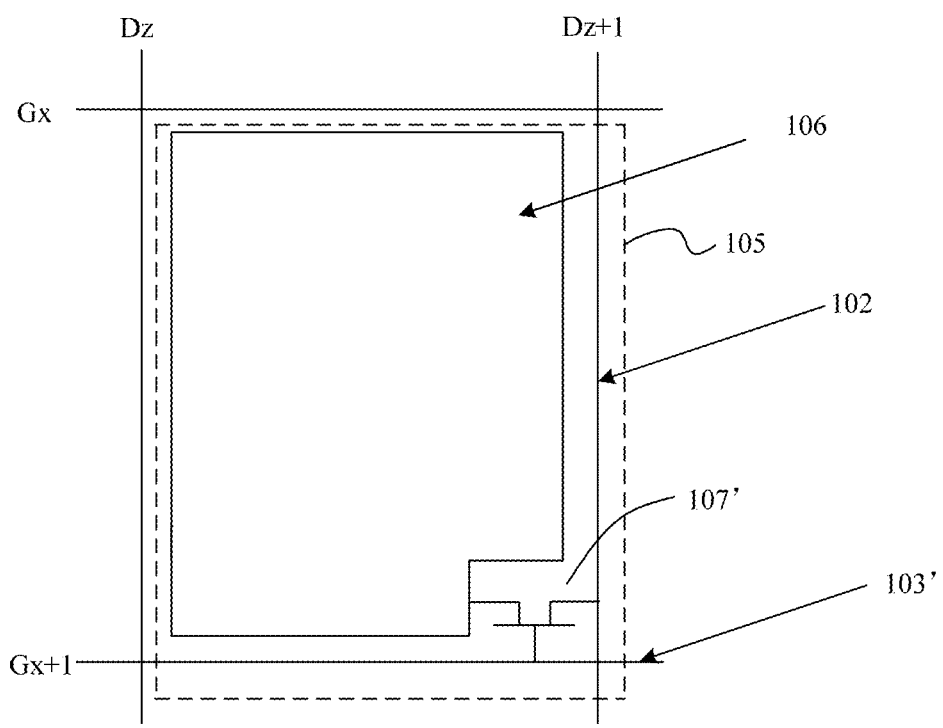
FIG. 2 is a schematic diagram of one sub-pixel.

For instance, as illustrated in FIG. 1, the array substrate may comprise a plurality of scanning signal lines 103' and a plurality of data signal lines 102 which are intersected with each other to define a plurality of sub-pixels 105 arranged in an array. For instance, the sub-pixels 105 may be arranged in a matrix. For instance, as illustrated in FIG. 2, a sub-pixel 105 may correspond to one data signal line 102 and one scanning signal line 103' and includes a pixel electrode 106 and a switching element 107'. The switching element 107' is connected to the scanning signal line 103' and the data signal line 102 and, for instance, may be a thin film transistor (TFT). For instance, the switching element 107' may be an N-type TFT and may also be a P-type TFT.

As technology advances, the resolution of display panels has been increased. However, power consumption is also increased and the bottleneck due to power consumption in display products, particularly in mobile products, has been more and more prominent. Generally, the power consumption is reduced through partial display. But partial display tends to bring inconvenience and adverse customer experience to users.

Figure 3:
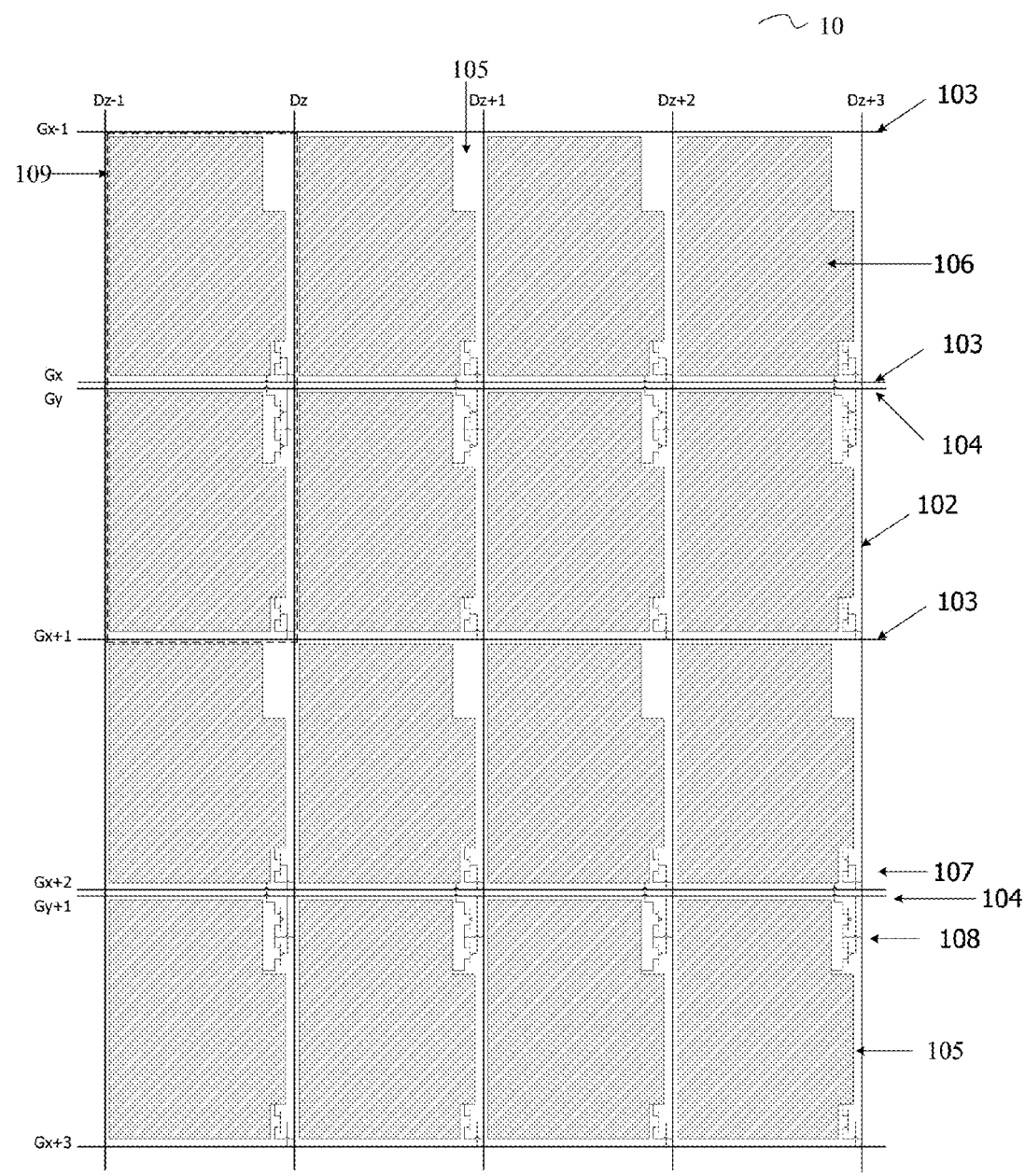
FIG. 3 is a schematic diagram of an array substrate provided by an embodiment of the present disclosure.
Figure 10:
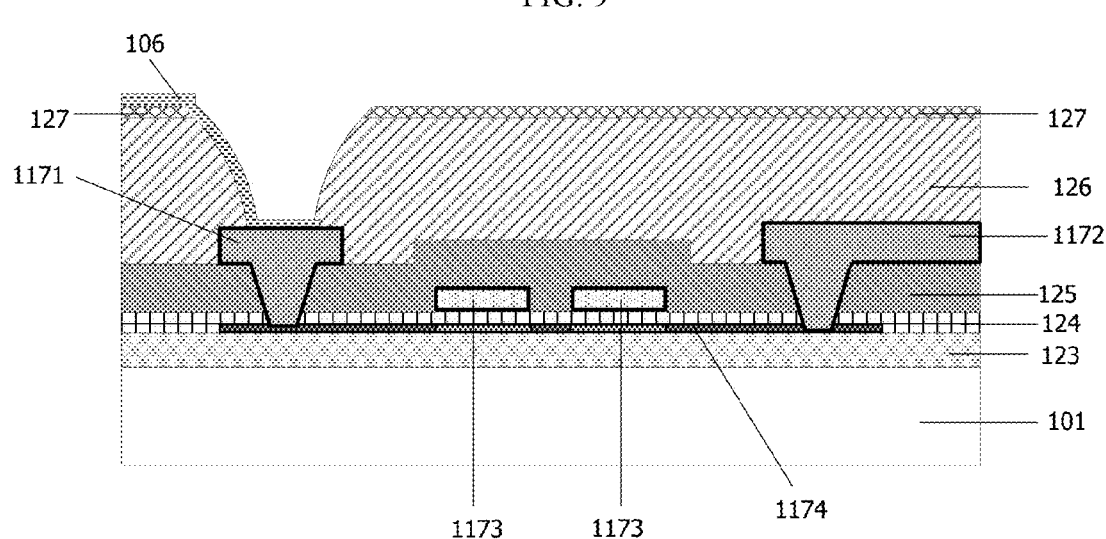
FIG. 10 is a sectional view of FIG. 6 in a direction A-A'.

One embodiment of the present disclosure provides an array substrate 10, which, as illustrated in FIG. 3, comprises: a base substrate 101 (as shown in FIG. 10) and a plurality of data signal lines 102, a plurality of first scanning signal lines 103 which are insulated from each other and intersected with the plurality of data signal lines 102, a plurality of second scanning signal lines 104 which are insulated from each other and intersected with the plurality of data signal lines 102, a plurality of first switching elements 107, and a plurality of second switching elements 108, which are disposed on the base substrate 101. The plurality of data signal lines 102 and the plurality of first scanning signal lines 103 are intersected with each other to define a plurality of sub-pixels 105 which are arranged in an array. Each sub-pixel 105 includes a pixel electrode 106.

One second scanning signal line 104 is disposed at a position corresponding to the (2N+1)th row of sub-pixels or the (2N+2)th row of sub-pixels, in which N is an integer greater than or equal to zero.

Each first switching element 107 is disposed in a sub-pixel corresponding to it and configured to control the on- and off-state of the corresponding sub-pixel, namely control the charging of the pixel electrode of the sub-pixel or not.

Each second switching element 108 is disposed in a sub-pixel group 109 corresponding to it and configured to control the on- and off-state of the sub-pixels in the corresponding sub-pixel group 109. Each second switching element is connected with one data signal line, one second scanning signal line and a plurality of pixel electrodes in the sub-pixel group provided with the second switching element. That is to say, each second switching element 108 controls the charging of the pixel electrodes of these sub-pixels.

Figure 4:
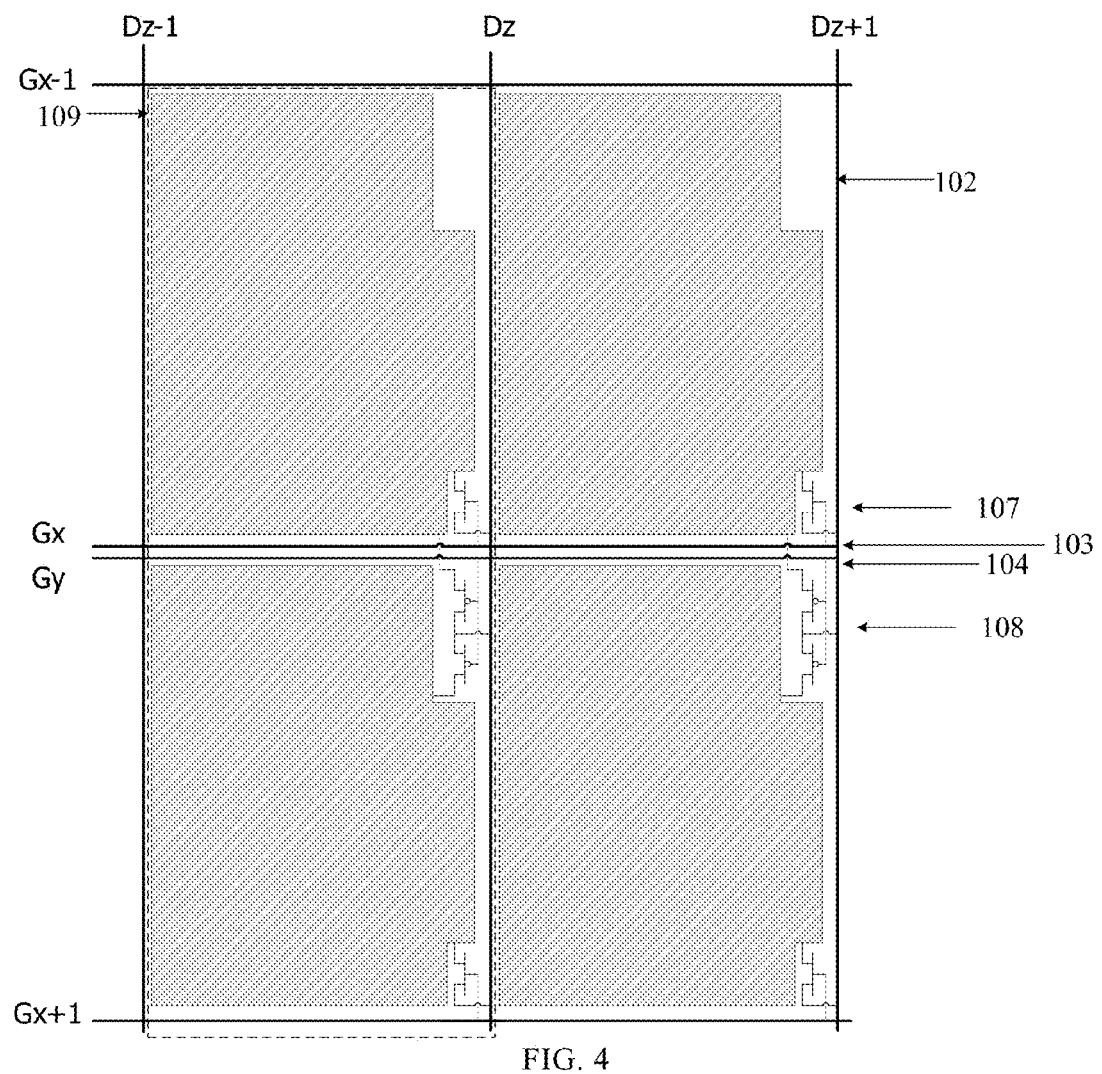
FIG. 4 is a schematic diagram of a second switching element and a sub-pixel group in the array substrate provided by an embodiment of the present disclosure.
Figure 5:
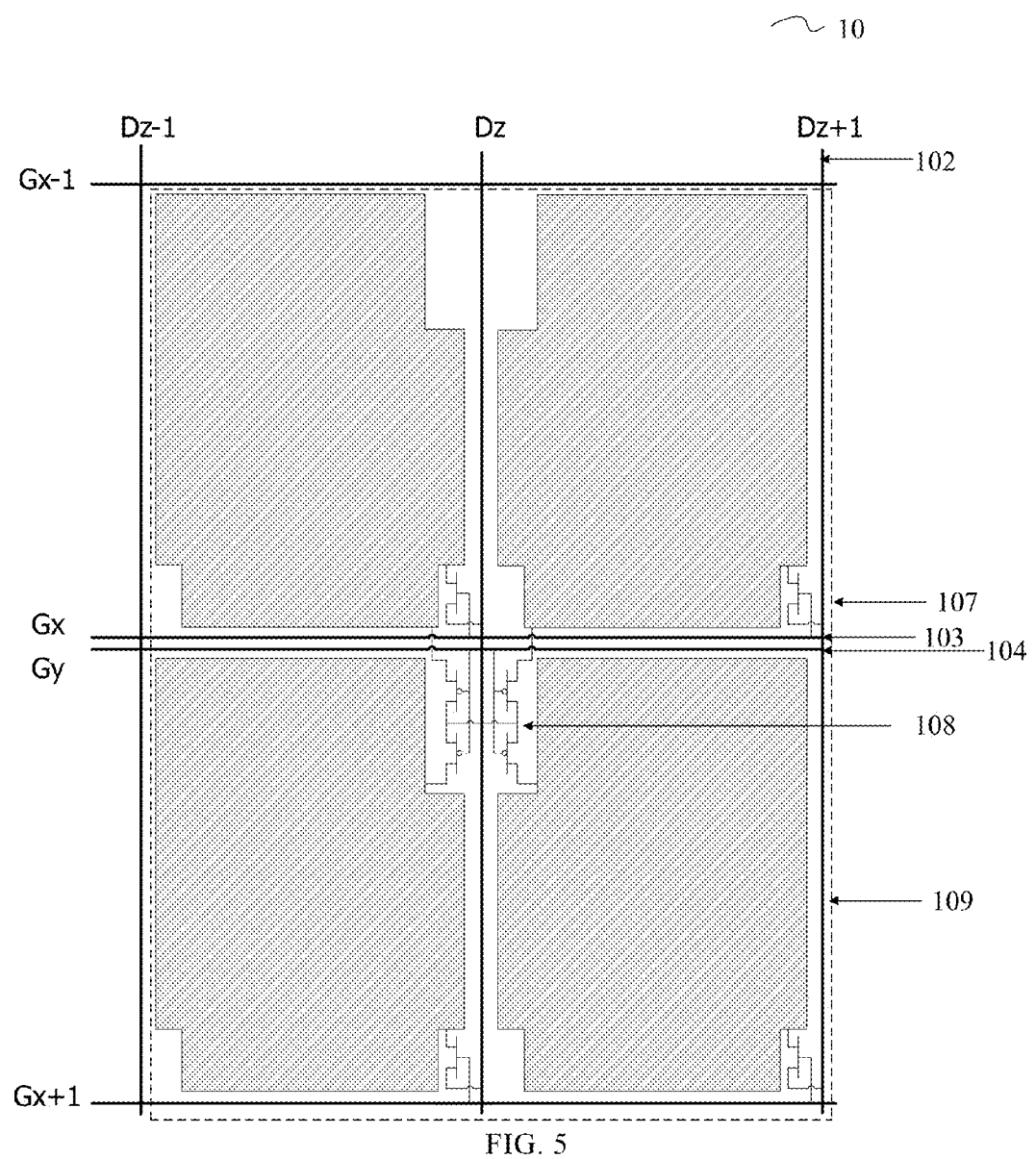
FIG. 5 is a schematic diagram of a second switching element and a sub-pixel group in an array substrate provided by another embodiment of the present disclosure.

One sub-pixel group 109, for instance, includes two sub-pixels which respectively belong to the (M+1)th column and are disposed in the (2N+1)th row and the (2N+2)th row of sub-pixels (as shown in FIG. 4), or includes four sub-pixels which respectively belong to the (2M+1)th column and the (2M+2)th column and are disposed in the (2N+1)th row and the (2N+2)th row of sub-pixels (as shown in FIG. 5), in which M is an integer greater than or equal to zero.

Each first scanning signal line 103 is configured to control a plurality of first switching elements in one row of sub-pixels, and each second scanning signal line 104 is configured to control a plurality of second switching elements 108 in one row of sub-pixel groups.

For instance, each first switching element is connected with the data signal line, the first scanning signal line and the pixel electrode in one sub-pixel.

Each first switching element 107, for instance, includes one first TFT 117. Each second switching element 108, for instance, includes at least one second TFT 118.

That is to say, in the embodiments of the present disclosure, the plurality of data signal lines 102 and the plurality of first scanning signal lines 103 of the array substrate are intersected with each other to define the plurality of sub-pixels 105 which are arranged in an array; and the sub-pixels are further divided into sub-pixel groups through the plurality of second scanning signal lines 104, for instance, the sub-pixel groups may be arranged sequentially. Each sub-pixel group includes two sub-pixels which respectively belong to the (M+1)th column and are disposed in the (2N+1)th row and the (2N+2)th row of sub-pixels, or includes four sub-pixels which respectively belong to the (2M+1)th column and the (2M+2)th column and are disposed in the (2N+1)th row and the (2N+2)th row of sub-pixels. For instance, one sub-pixel group includes two sub-pixels, disposed in the same column, in two rows of sub-pixels or includes four sub-pixels in two adjacent columns, which sub-pixels correspond to a second scanning signal line 104, and sub-pixels in different sub-pixel groups are different from each other.

It should be noted that the value of N in "one second scanning signal line is disposed at the position corresponding to the (2N+1)th row or the (2N+2)th row of sub-pixels" corresponds to the value of N in "one sub-pixel group includes two sub-pixels which respectively belong to the (M+1)th column and are disposed in the (2N+1)th row and the (2N+2)th row of sub-pixels, or includes four sub-pixels which respectively belong to the (2M+1)th column and the (2M+2)th column and are disposed in the (2N+1)th row and the (2N+2)th row of sub-pixels".

For instance, each sub-pixel group includes two sub-pixels which respectively belong to the (M+1)th column and are disposed in the (2N+1)th row and the (2N+2)th row of sub-pixels, which may be as shown in FIG. 4. For instance, each sub-pixel group may include four sub-pixels which respectively belong to the (2M+1)th column and the (2M+2)th column and are disposed in the (2N+1)th row and the (2N+2)th row of sub-pixels, which may be as shown in FIG. 5.

For instance, when N is 0 and M is 0, namely each sub-pixel group includes two sub-pixels which respectively belong to the 1st column and are disposed in the 1st row and the 2nd row of sub-pixels, the case can be as shown in FIG. 4. For instance, similarly when each sub-pixel group includes four sub-pixels which respectively belong to the 1st column and the 2nd column and are disposed in the 1st row and the 2nd row of sub-pixels, the case can be as shown in FIG. 5.

For instance, the second switching element 108 which controls the on- and off-state of the plurality of sub-pixels in one sub-pixel group 109 may include one or more second TFTs 118.

Figure 6:
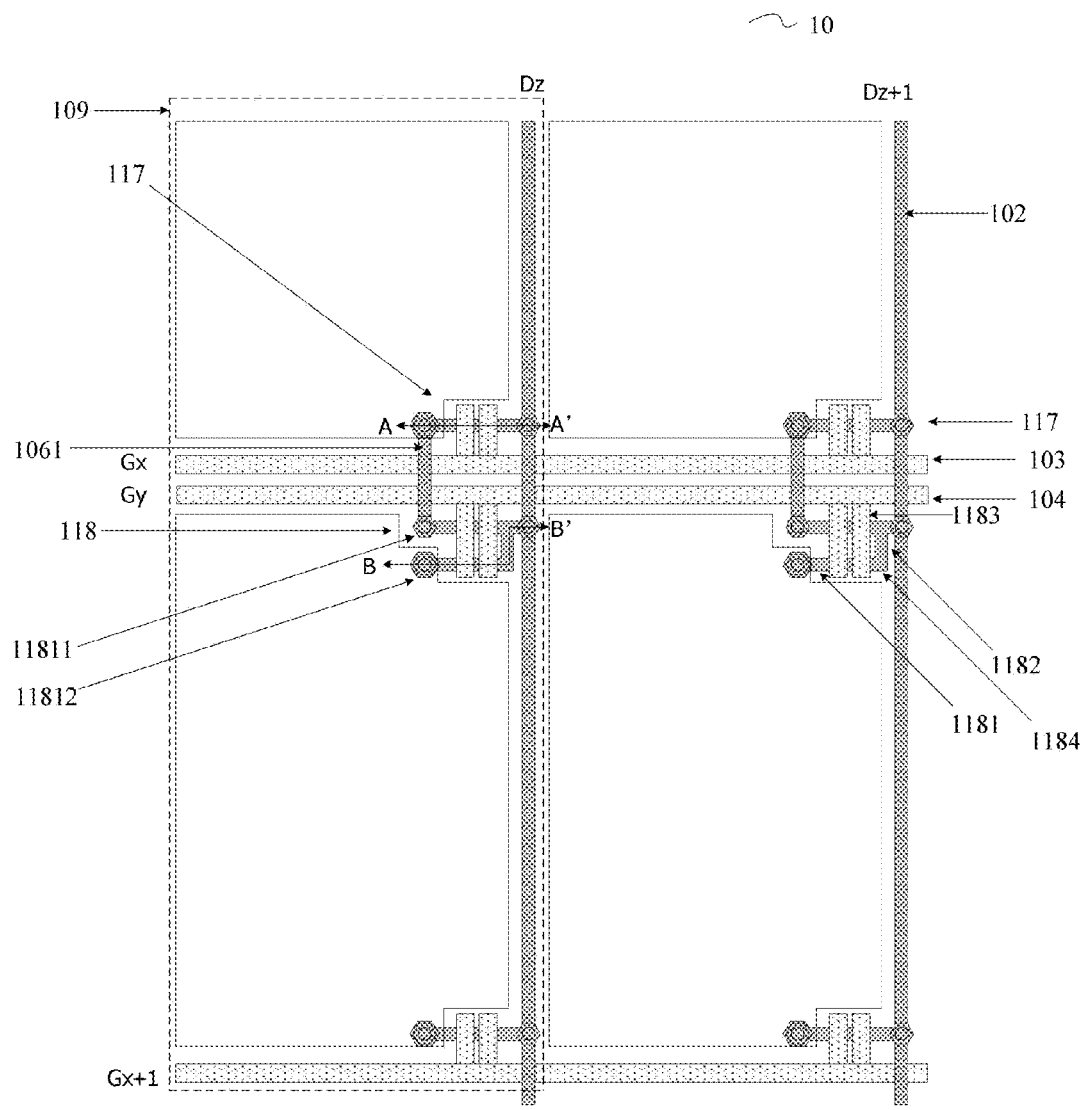
FIG. 6 is a schematic diagram illustrating the setting mode of second TFTs in the array substrate provided by an embodiment of the present disclosure.

For instance, as shown in FIG. 6, as for each sub-pixel group, in each column of sub-pixels, one second TFT 118 may be disposed in the (2N+1)th row or the (2N+2)th row of sub-pixels.

The second TFT 118 includes a first drain electrode 11811 and a second drain electrode 11812 which are both connected with an active layer 1184 of the second TFT 118. The first drain electrode 11811 and the second drain electrode 11812 are spaced from each other and respectively connected with the pixel electrode in the (2N+1)th row of sub-pixels and the pixel electrode 106 in the (2N+2)th row of sub-pixels. A source electrode 1182 of the second TFT 118 is connected with the data signal line 102. A gate electrode 1183 of the second TFT 118 is connected with the second scanning signal line 104 which is disposed at the position corresponding to the (2N+1)th row of sub-pixels or the (2N+2)th row of sub-pixels.

For instance, when N is 0, in each column of sub-pixels, one second TFT 118 may be disposed in the 1st row of sub-pixels or the 2nd row of sub-pixels for each sub-pixel group; the second TFT 118 includes a first drain electrode 11811 and a second drain electrode 11812 which are spaced from each other and respectively connected with the pixel electrode in the 1st row of sub-pixels and the pixel electrode 106 in the 2nd row of sub-pixels; a source electrode 1182 of the second TFT 118 is connected with the data signal line 112; and a gate electrode 1183 of the second TFT 118 is connected with the second scanning signal line 104 which is disposed at a position corresponding to the 1st row of sub-pixels or the 2nd row of sub-pixels.

For instance, as illustrated in FIG. 6, the pixel electrode 106 of the (2N+1)th row of sub-pixels or the (2N+2)th row of sub-pixels is provided with a connecting portion 1061 which is connected with the second TFT 118, or provided with a connecting electrode 1061 which is configured to connect the pixel electrode 106 of the (2N+1)th row of sub-pixels or the (2N+2)th row of sub-pixels with the second TFT 118, for instance, the first drain electrode 11811 of the second TFT 118.

For instance, when N is 0, the pixel electrode of the 1st row of sub-pixels or the 2nd row of sub-pixels is provided with a connecting portion 1061 which is connected with the second TFT 118, or provided with a connecting electrode 1061 which is configured to connect the pixel electrode 106 of the 1st row of sub-pixels or the 2nd row of sub-pixels with the second TFT 118.

For instance, the connecting portion 1061 may be formed in the same layer as the pixel electrode. For the purpose of convenient production, the data signal lines, the connecting portions or the connecting electrodes 1061, and the pixel electrodes may be formed in the same layer. The connecting electrode may also be connected with the pixel electrode and the drain electrode (the first drain electrode 11811 or the second drain electrode 11812) of the second TFT via a through hole. The connecting electrode may also be formed in different layers with the pixel electrode and the data signal line. No specific limitation will be given here.

For instance, as illustrated in FIG. 6, in each sub-pixel group, source electrodes 1182 of the second TFTs 118 in each column of sub-pixels are all connected with the data signal line 102 for defining the column of sub-pixels on a same side. For instance, the same side includes the left side or the right side.

Figure 7:
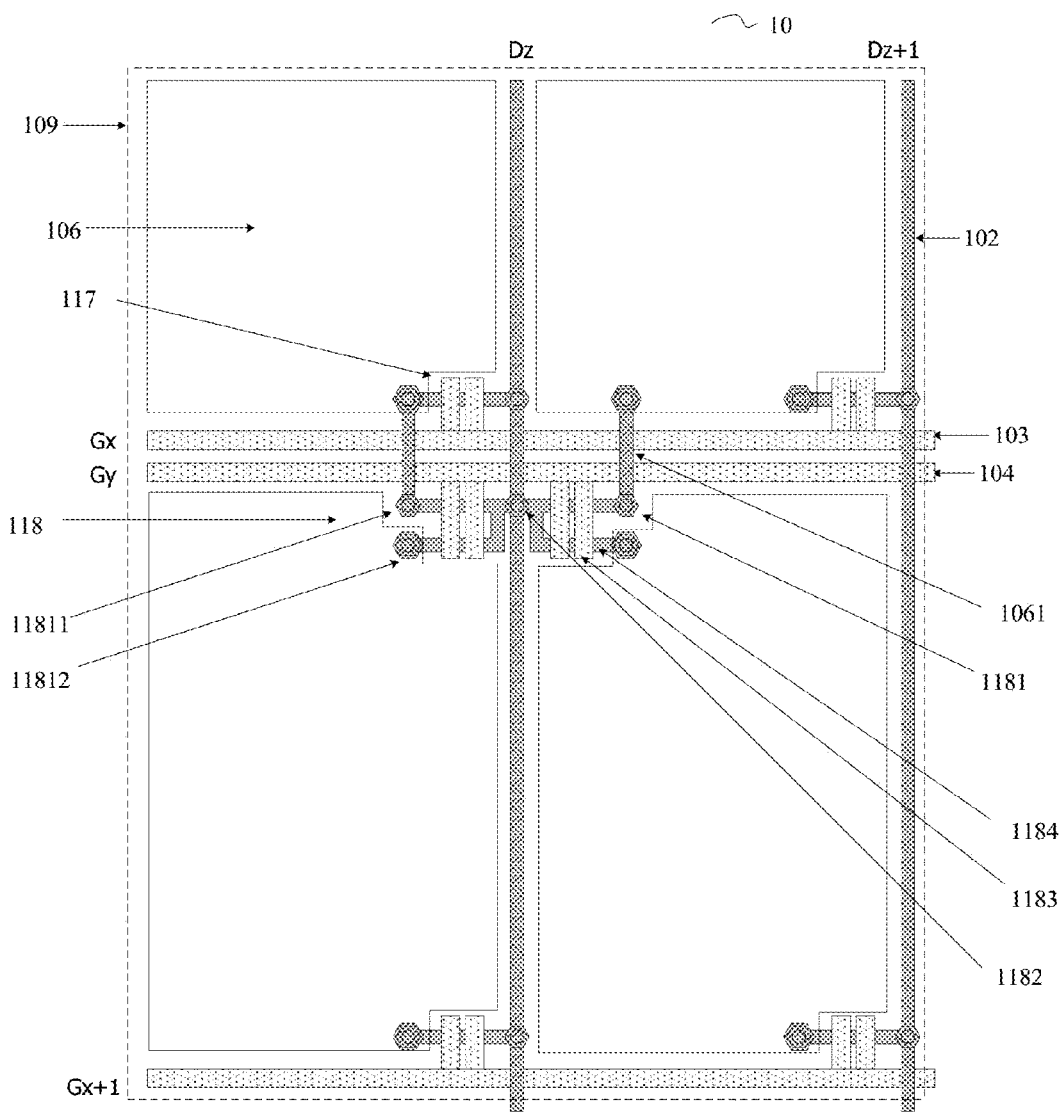
FIG. 7 is a schematic diagram illustrating the setting mode of second TFTs in an array substrate provided by another embodiment of the present disclosure.

Moreover, for instance, as illustrated in FIG. 7, source electrodes of the second TFTs in the (2M+1)th column and the (2M+2)th column of sub-pixels are all connected with the data signal line 102 disposed between the two columns of sub-pixels.

For instance, in the sub-pixel array, the second scanning signal line 104 may be disposed in the (2N+1)th row and may also be disposed in the (2N+2)th row and is not overlapped with the first scanning signal line 103 between the (2N+1)th row and the (2N+2)th row of sub-pixels. For instance, a projection of the second scanning signal line on the base substrate is disposed at a position between projections of the pixel electrode of the (2N+1)th row of sub-pixels and the pixel electrode of the (2N+2)th row of sub-pixels on the base substrate, and may also be disposed at another position of the (2N+1)th row of sub-pixels or the (2N+2)th row of sub-pixels. No specific limitation will be given here.

Figure 8:
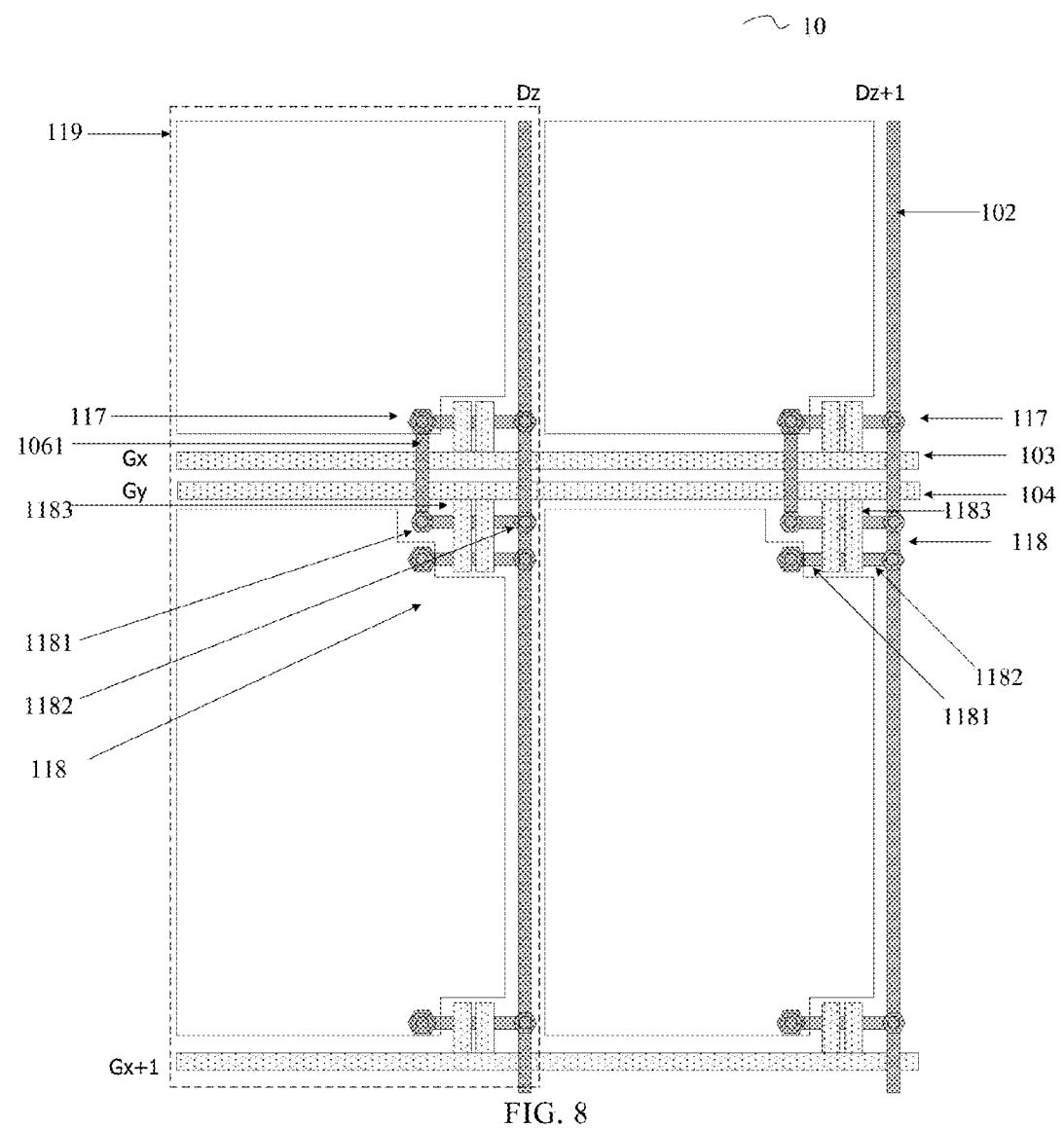
FIG. 8 is a schematic diagram illustrating the setting mode of second TFTs in an array substrate provided by another embodiment of the present disclosure.
Figure 9:
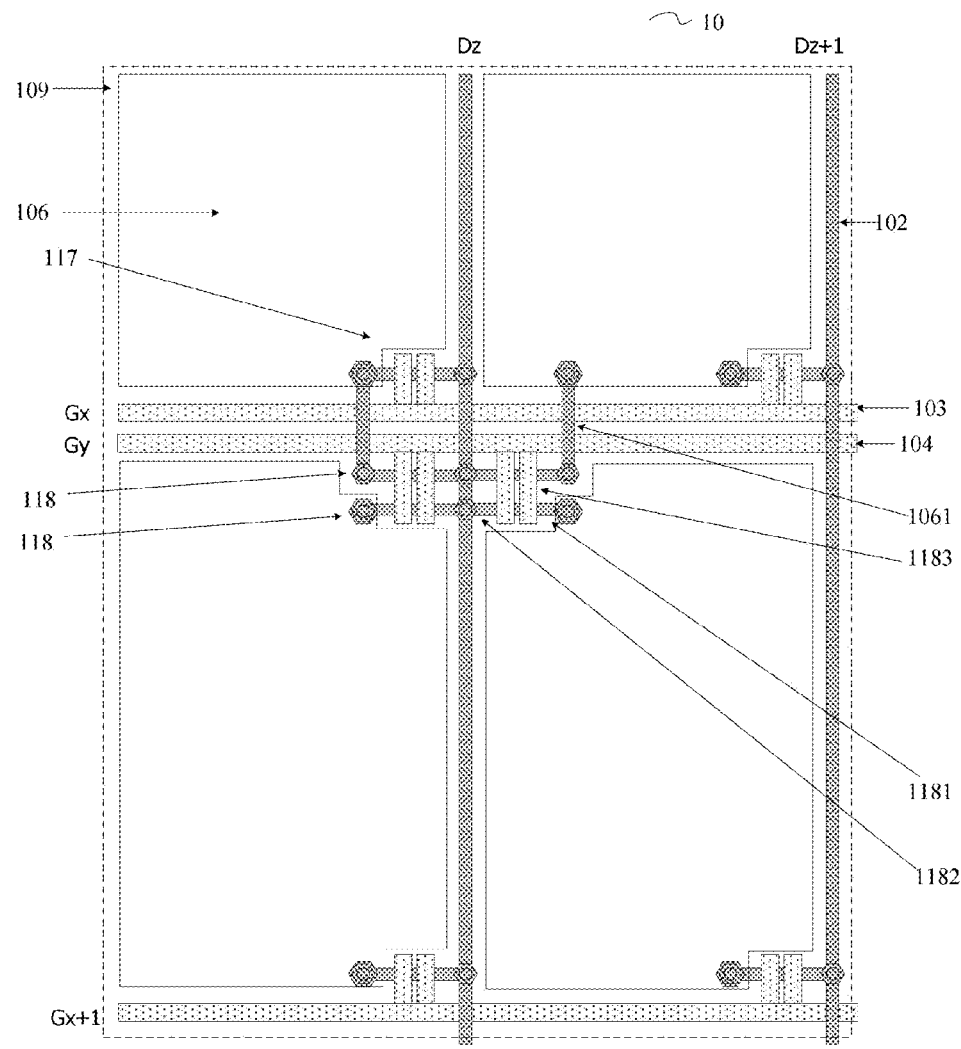
FIG. 9 is a schematic diagram illustrating the setting mode of second TFTs in an array substrate provided by another embodiment of the present disclosure.

It should be noted that the second TFTs 118 are not limited to the above form. For instance, as illustrated in FIG. 8 or 9, as for each sub-pixel group, in each column of sub-pixels, two second TFTs 118 may be disposed in the (2N+1)th row of sub-pixels or the (2N+2)th row of sub-pixels. Both the gate electrodes 1183 (one gate electrode may be shared) of the two second TFTs are connected with the second scanning signal line 104 which is disposed at the position corresponding to the (2N+1)th row of sub-pixels or the (2N+2)th row of sub-pixels; both the source electrodes 1182 of the two second TFTs are connected with the same data signal line 102; and the drain electrodes 1181 of the two second TFTs are respectively connected with the pixel electrode 106 in the (2N+1)th row of sub-pixels or the pixel electrode 106 in the (2N+2)th row of sub-pixels.

For instance, as illustrated in FIG. 8 or 9, in each sub-pixel group, the pixel electrode 106 away from the second scanning signal line 104 is provided with a connecting portion 1061 which is connected with the drain electrode 1181 of the second TFT, or provided with a connecting electrode 1061 which is configured to connect the pixel electrode 106 away from the second scanning signal line 104 with the drain electrode 1181 of one of the second TFTs.

For instance, as illustrated in FIG. 8, in each sub-pixel group, the source electrodes 1182 of the second TFTs 118 in each column of sub-pixels are connected with the data signal line 102 for defining the column of sub-pixels 105 on the same side. For instance, the same side includes the left side or the right side.

Moreover, for instance, as illustrated in FIG. 9, in each sub-pixel group, source electrodes 1182 of a plurality of second TFTs 118 in the (2M+1)th column and the (2M+2)th column of sub-pixels are all connected with the data signal line 102 disposed between the two columns of sub-pixels.

For instance, as for each sub-pixel group, in each column of sub-pixels, the plurality of second TFTs for simultaneously controlling the on- and off-state of the plurality of sub-pixels in the (2N+1)th row of sub-pixels and the (2N+2)th row of sub-pixels are provided with the same gate electrode.

As illustrated in FIGS. 6 and 8, one sub-pixel group includes two sub-pixels in the same column and in two adjacent rows of sub-pixels, namely upper and lower rows, and sub-pixels in different sub-pixel groups are different from each other. Each second switching element 108 is disposed in a corresponding sub-pixel group 109 and includes one second TFT 118 (as shown in FIG. 6) or two second TFTs 118 (as shown in FIG. 8).

As illustrated in FIGS. 7 and 9, one sub-pixel group includes four sub-pixels in two adjacent columns and in two adjacent rows of sub-pixels, namely upper and lower rows, and sub-pixels in different sub-pixel groups are different from each other. Each second switching element 108 is disposed in a corresponding sub-pixel group 109 and includes two second TFTs 118 (as shown in FIG. 7) or four second TFTs 118 (as shown in FIG. 9).

It should be noted that the second switching element 108 may also adopt other forms. No limitation will be given here.

For instance, the pixel electrode 106 of each sub-pixel 105 is connected with the first scanning signal line 103 and the data signal line 102 through one first TFT 117.

For instance, the first TFT may be an N-type TFT or a P-type TFT, and the second TFT may be an N-type TFT or a P-type TFT. For instance, the first TFT is an N-type TFT, and the second TFT is a P-type TFT. Or the first TFT is a P-type TFT, and the second TFT is an N-type TFT. Or both the first TFT and the second TFT are an N-type TFT. Or both the first TFT and the second TFT are a P-type TFT. The present disclosure is not limited thereto.

For instance, the N-type TFT may be an N-type metal-oxide-semiconductor (NMOS) TFT, and the P-type TFT may be a P-type metal-oxide-semiconductor (PMOS) TFT. The present disclosure is not limited thereto.

For instance, the first TFT in the embodiment of the present disclosure may be manufactured by a conventional method, for instance, may be a polycrystalline silicon (poly-Si) TFT. For instance, the first TFT may be an N-type TFT, heavily doped with P+ ions (phosphorus ions). The second TFT in the embodiments of the present disclosure may be manufactured by a conventional method, for instance, may be a poly-Si TFT. For instance, the second TFT may be a P-type TFT, heavily doped with B+ ions (boron ions). But the present disclosure is not limited thereto.

FIG. 10 is a sectional view of FIG. 6 in a direction A-A'. A buffer layer 123 is disposed on the base substrate 101. An active layer 1174 of the first TFT 117 is disposed on the buffer layer 123. A first insulating layer 124 is disposed between a gate electrode 1173 and the active layer 1174 of the first TFT 117. A second insulating layer 125 is disposed on the gate electrode 1173. A source electrode 1172 and a drain electrode 1171 of the first TFT 117 are each connected with the active layer 1174 via a through hole. A planarization layer 126 and a passivation layer 127 are disposed on the source electrode 1172 and the drain electrode 1171. The pixel electrode 106 is connected with the drain electrode 1171 of the first TFT 117 via a through hole.

Figure 11:
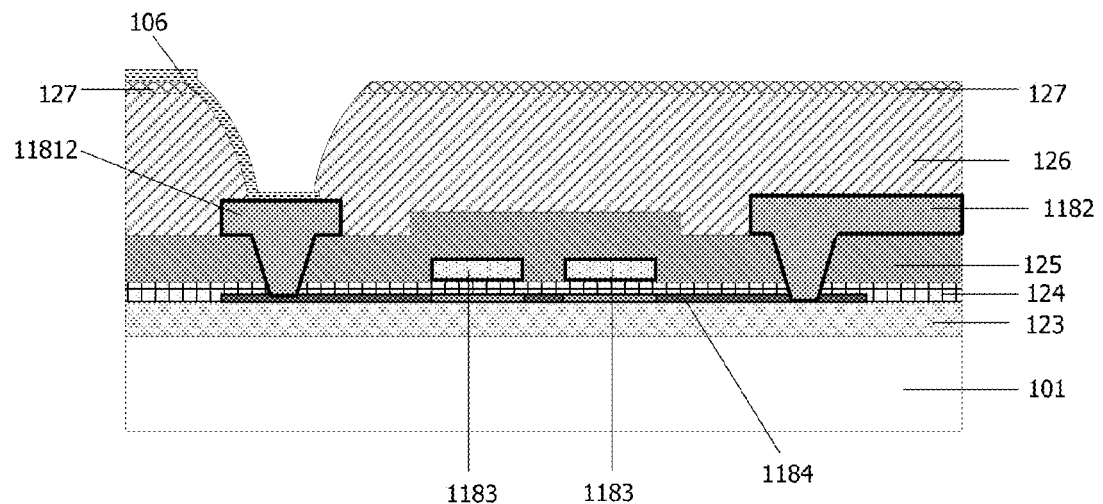
FIG. 11 is a sectional view of FIG. 6 in a direction B-B'.

FIG. 11 is a sectional view of FIG. 6 in a direction B-B'. A buffer layer 123 is disposed on the base substrate 101. An active layer 1184 of the second TFT 118 is disposed on the buffer layer 123. A first insulating layer 124 is disposed between a gate electrode 1183 and the active layer 1184 of the second TFT. A second insulating layer 125 is disposed on the gate electrode 1183. A source electrode 1182 and a drain electrode 1181 of the second TFT are connected with the active layer 1184 via a through hole. A planarization layer 126 and a passivation layer 127 are disposed on the source electrode 1182 and the drain electrode 1181. The pixel electrode 106 is connected with the drain electrode 1181 of the second TFT via a through hole.

FIGS. 10 and 11 only illustrate one example. The layer structure of the array substrate provided by the embodiments of the present disclosure is not limited thereto.

For instance, when N is selected from integers greater than or equal to zero, namely appropriate N values are all selected, and M is selected from integers greater than or equal to zero, namely appropriate M values are all selected, a repetitive unit of the array substrate may be as shown by the sub-pixel group in a dashed box of FIG. 6, 7, 8 or 9. For instance, the sub-pixel group in the dashed box of FIG. 6, 7, 8 or 9 is constantly repeated in the horizontal and vertical directions to form an array of the array substrate.

Another embodiment of the present disclosure further provides a method for driving any foregoing array substrate, which comprises the following operations:

in a first mode (normal mode), applying scanning-on-signals over the first scanning signal lines 103 and applying scanning-off-signals over the second scanning signal lines 104; and in a second mode (power-saving mode), applying scanning-off-signals over the first scanning signal lines 103, applying scanning-on-signals over the second scanning signal lines 104, and applying data signals over the data signal lines connected with the second switching elements.

For instance, in the second mode (power-saving mode), data signals are applied to all the data signal lines 102. The data signal lines are connected with the second switching elements, for instance, the second TFTs. That is to say, data signals are applied to the data signal lines connected with the second switching elements. When the sub-pixel groups as shown in FIGS. 4, 6 and 8 are taken as the repetitive units of the array substrate, the number of gate driving signal lines can be reduced by half (the number of the scanning signal lines applied with signals can be reduced by half), namely the resolution can be reduced by half under full-screen display.

Or data signals may also be applied to the data signal lines 102 connected with the second switching elements and disposed between the (2M+1)th column and the (2M+2)th column of sub-pixels 105. The data signal lines are connected with the second switching elements, for instance, the second TFTs. That is to say, data signals are applied to the data signal lines connected with the second switching elements. When the sub-pixel groups as shown in FIGS. 5, 7 and 9 are taken as the repetitive units of the array substrate, the number of the gate driving signal lines can be reduced by half (the number of the scanning signal lines applied with signals can be reduced by half), and the number of the data signal lines applied with signals can be reduced by half, namely the resolution can be reduced by three quarters in the case of full-screen display.

For instance, when the first TFT is an N-type TFT and the second TFT is a P-type TFT, in the first mode (normal mode), high-level signals are applied to the first scanning signal lines 103; and in the second mode (power-saving mode), low-level signals are applied to the second scanning signal lines 104.

Description is given above by taking the case that one second scanning signal line is disposed at the position corresponding to the (2N+1)th row of sub-pixels or the (2N+2)th row of sub-pixels as an example, while description is given below by taking the case that one second scanning signal line is disposed at a position corresponding to the (N+1)th row of sub-pixels as an example.

Figure 12:
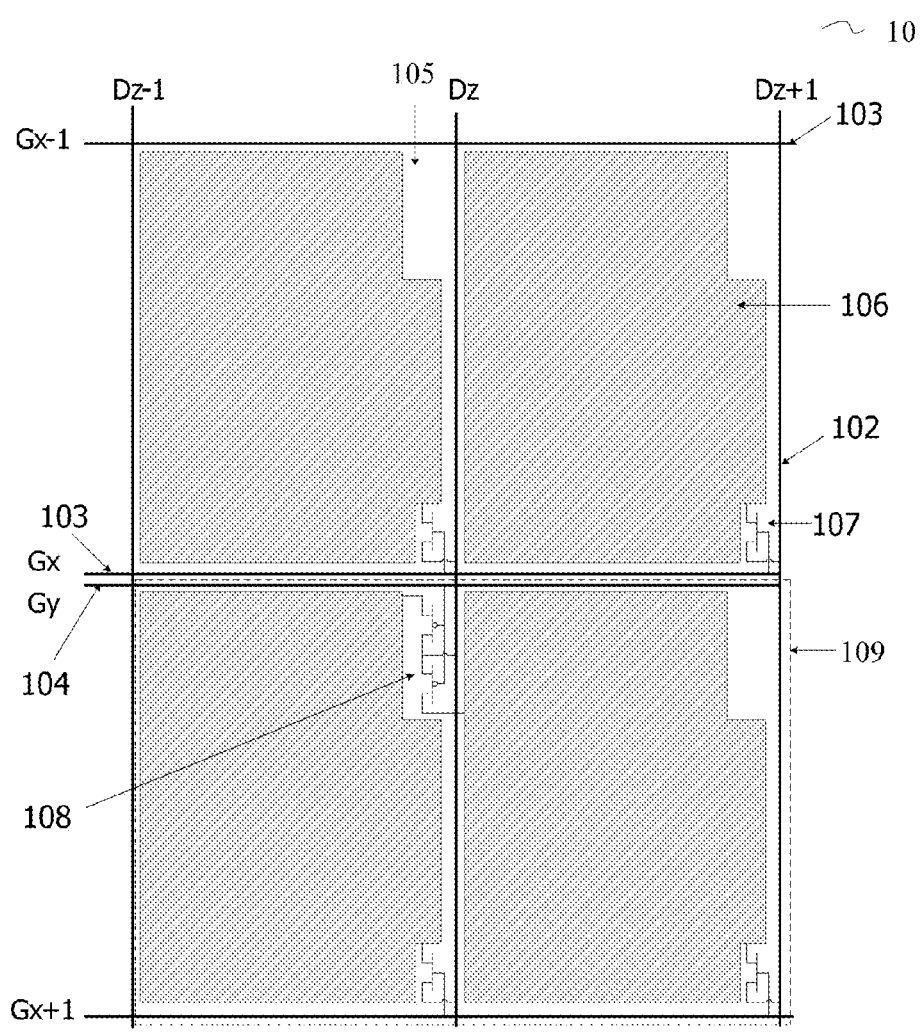
FIG. 12 is a schematic diagram of an array substrate provided by still another embodiment of the present disclosure.
Figure 14:
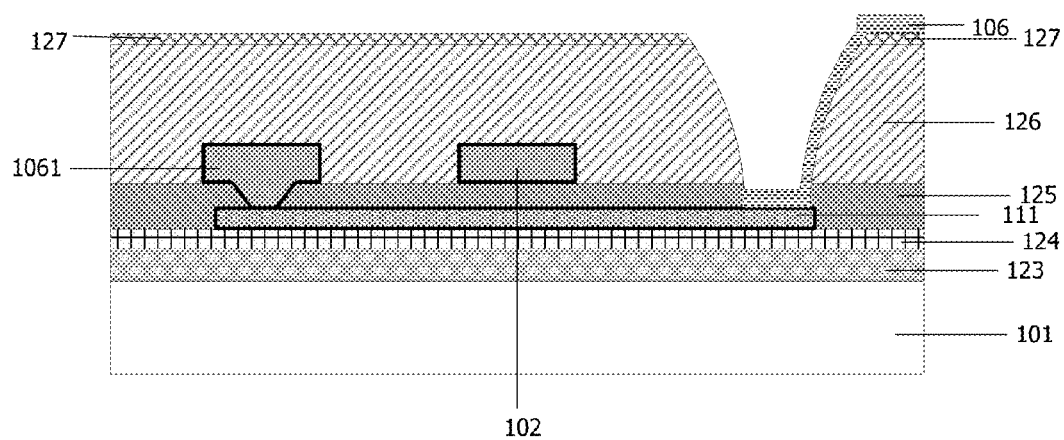
FIG. 14 is a sectional view of FIG. 13 in a direction C-C'.

Another embodiment of the present disclosure further provides an array substrate 10, which, as illustrated in FIG. 12, comprises: a base substrate 101 (as shown in FIG. 14) and a plurality of data signal lines 102, a plurality of first scanning signal lines 103 which are insulated from each other and intersected with the plurality of data signal lines 102, a plurality of second scanning signal lines 104 which are insulated from each other and intersected with the plurality of data signal lines 102, a plurality of first switching elements 107, and a plurality of second switching elements 108, which are disposed on the base substrate 101. The plurality of data signal lines 102 and the plurality of first scanning signal lines 103 are intersected with each other to define a plurality of sub-pixels 105 which are arranged in an array. Each sub-pixel 105 includes a pixel electrode 106.

One second scanning signal line 104 is disposed at a position corresponding to the (N+1)th row of sub-pixels (e.g., each row of sub-pixels), in which N is an integer greater than or equal to zero.

Each first switching element 107 is disposed in a corresponding sub-pixel and configured to control the on- and off-state of the corresponding sub-pixel, namely control the charging of the pixel electrode of the sub-pixel or not.

Each second switching element 108 is disposed in a corresponding sub-pixel group 109 and configured to simultaneously control the on- and off-state of the sub-pixels in the corresponding sub-pixel group. Each second switching element is connected with one data signal line, one second scanning signal line and a plurality of pixel electrodes in the sub-pixel group provided with the second switching element. That is to say, each second switching element 108 controls the charging of the pixel electrodes of the sub-pixels.

Figure 13:
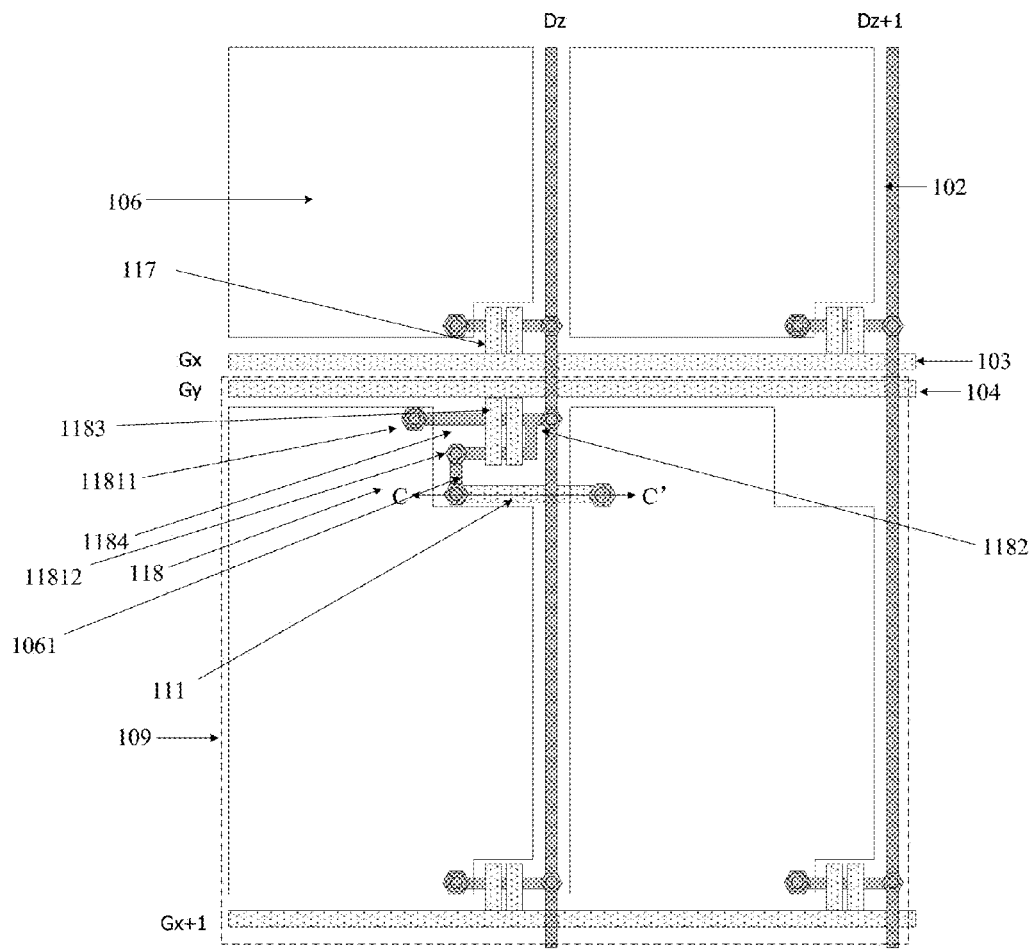
FIG. 13 is a schematic diagram illustrating the setting mode of second TFTs in the array substrate provided by still another embodiment of the present disclosure.

One sub-pixel group 109, for instance, includes two sub-pixels which respectively belong to the (N+1)th row and are disposed in the (2M+1)th column and the (2M+2)th column of sub-pixels (as shown in FIGS. 12 and 13), in which M is an integer greater than or equal to zero.

Each first scanning signal line 103 is configured to control a plurality of first switching elements 107 in one row of sub-pixels, and each second scanning signal line 104 is configured to control a plurality of second switching elements 108 in one row of sub-pixel groups.

For instance, each first switching element is connected with the data signal line, the first scanning signal line and the pixel electrode in one sub-pixel.

Each first switching element 107, for instance, includes one first TFT 117. Each second switching element 108, for instance, includes at least one second TFT 118.

For instance, in each sub-pixel group, one second TFT 118 may be disposed in two sub-pixels which respectively belong to the (N+1)th row and are disposed in the (2M+1)th column and the (2M+2)th column of sub-pixels, as shown in FIG. 13.

For instance, as illustrated in FIG. 13, the second TFT 118 includes a first drain electrode 11811 and a second drain electrode 11812 which are both connected with an active layer 1184 of the second TFT 118. The first drain electrode 11811 and the second drain electrode 11812 are spaced from each other; the first drain electrode 11811 is connected with the pixel electrode in the (2M+1)th column of sub-pixels in the (N+1)th row; the second drain electrode 11812 is connected with a connecting electrode 1061 via a through hole; the connecting electrode 1061 is connected with a connecting line 111 via a through hole; the connecting line 111 is connected with the pixel electrode 106 in the (2M+2)th column of sub-pixels via a through hole; a source electrode 1182 of the second TFT 118 is connected with the data signal line 102 disposed in the (N+1)th row and between the (2M+1)th column and the (2M+2)th column of sub-pixels; and a gate electrode 1183 of the second TFT 118 is connected with the second scanning signal line 104 which is disposed at the position corresponding to the (N+1)th row of sub-pixels. For instance, the arrangement mode of the first drain electrode 11811 and the second drain electrode 11812 in the embodiment and other components on the array substrate being disposed in a same layer may be as described above. No further description will be given here.

FIG. 14 is a sectional view of FIG. 13 in the C-C' direction. A buffer layer 123 is disposed on the base substrate 101. A first insulating layer 124 is disposed on the buffer layer 123. A connecting line 111 is disposed on the first insulating layer 124. A second insulating layer 125 is disposed on the connecting line 111. The connecting electrode 1061 is connected with the connecting line 111 via a through hole. A planarization layer 126 and a passivation layer 127 are disposed on the connecting electrode 1061 and the data signal line 102. The pixel electrode 106 is disposed on the passivation layer 127 and connected with the connecting line 111 via a through hole. For instance, in the embodiment, the connecting line 111 may be formed in the same layer as the gate electrode, the first scanning signal line and the second scanning signal line. The connecting electrode 1061 may be formed in the same layer as the data signal line 102.

For instance, an embodiment of the present disclosure provides a method for driving the array substrate in which one sub-pixel group is formed by two adjacent sub-pixels in the same row, which comprises the following operations:

in a first mode (normal mode), applying scanning-on-signals over the first scanning signal lines 103 and applying scanning-off-signals over the second scanning signal lines 104; and in a second mode (power-saving mode), applying scanning-off-signals over the first scanning signal lines 103, applying scanning-on-signals over the second scanning signal lines 104, and applying data signals over the data signal lines connected with the second switching elements.

For instance, in the second mode (power-saving mode), data signals are applied to the data signal lines 102 connected with the second switching elements and disposed between the (2M+1)th column and the (2M+2)th column of sub-pixels 105. The data signal line is connected with the second switching element, for instance, the second TFT. That is to say, data signals are applied to the data signal lines connected with the second switching elements. When the sub-pixel groups as shown in FIGS. 12 and 13 are taken as the repetitive units of the array substrate, the number of the data signal lines applied with signals can be reduced by half, namely the resolution can be reduced by half under full-screen display.

A first TFT and a second TFT are embodied below.

For instance, in one embodiment of the present disclosure, the first TFT includes a drain electrode 1171, a source electrode 1172, a gate electrode 1173 and an active layer 1174;

the drain electrode 1171 and the source electrode 1172 are spaced from each other, are both connected with the active layer 1174, and are respectively disposed on both sides of the active layer 1174; the first scanning signal line 103 is connected with the gate electrode 1173; the data signal line 102 is connected with the source electrode 1172; and the drain electrode 1171 is connected with a pixel electrode. The case may refer to FIGS. 10 and 6. For instance, the gate electrode 1173 may be formed in the same layer as the first scanning signal line 103. For instance, the source electrode 1172 and the drain electrode 1171 may be formed in the same layer as the data signal line 102.

For instance, in one embodiment of the present disclosure, the second TFT may include a drain electrode 1181, a source electrode 1182, a gate electrode 1183 and an active layer 1184; the drain electrode 1181 and the source electrode 1182 are spaced from each other, are both connected with the active layer 1184, and are respectively disposed on both sides of the active layer 1184; the second scanning signal line 104 is connected with the gate electrode 1183; the data signal line 102 is connected with the source electrode 1182;

and the drain electrode 1181 is connected with the pixel electrode. The case may refer to FIGS. 11 and 6. For instance, the gate electrode 1183 may be formed in the same layer as the second scanning signal line 104. For instance, the second scanning signal line 104 may be formed in the same layer as the first scanning signal line 103. For instance, the source electrode 1182 and the drain electrode 1181 may be formed in the same layer as the data signal line 102. For instance, the drain electrode 1181 may include a first drain electrode 11811 and a second drain electrode 11812. Thus, the first drain electrode 11811, the second drain electrode 11812 and the source electrode 1182 may be formed in the same layer as the data signal line 102. For instance, the first drain electrode 11811 and the second drain electrode 11811 are respectively connected with pixel electrodes of two sub-pixels which respectively belong to the same column and are disposed in two adjacent rows of sub-pixels, or respectively connected with pixel electrodes of two sub-pixels which respectively belong to the same row and are disposed in two adjacent columns of sub-pixels.

Another embodiment of the present disclosure further provides a display device, which comprises any one of the foregoing array substrates 10. The display device may, for instance, be a display panel, a liquid crystal display (LCD) device, an organic light-emitting diode (OLED) display device, an e-paper display device, etc.

Moreover, for instance, the LCD device provided by one embodiment of the present disclosure may adopt vertical alignment (VA) display mode and may also adopt advanced super dimension switch (ADS) display mode, twisted nematic (TN) display mode or in-plane switching (IPS) display mode. No limitation will be given here. Furthermore, the LCD device not only is provided with an array substrate but also is provided with an opposing substrate, e.g., a CF substrate so as to form a liquid crystal cell with the array substrate.

For instance, pixel electrodes and common electrodes are arranged in different layers. A common electrode layer disposed on the top of the array substrate may be slit-shaped, and the pixel electrodes close to a base substrate may be planar. The display device provided with the above array substrate is a high aperture ratio advanced super dimension switch (HADS) display device. In the HADS technology, a multi-dimensional electric field is formed by horizontal electric fields produced at the edge of the common electrode layer and vertical electric fields produced between the pixel electrodes and the common electrode layer, in the same plane, so that liquid crystal molecules in all the alignments between the pixel electrodes and over the electrodes in the liquid crystal cell can all rotate and be transformed, and hence the working efficiency of liquid crystals with in-plane alignment can be improved and the light transmittance can be increased. The ADS mode may also be adopted. A pixel electrode layer disposed on the top of the array substrate may be slit-shaped, and the common electrodes close to the base substrate may be planar.

For instance, when the common electrode layer is formed on the opposing substrate which is cell-assembled together with the array substrate, the formed display device is a TN-type display device. The difference is that: in the TN-type display device, an LCD adopting the principle of vertical electric field drives TN mode liquid crystals through vertical electric fields formed between the pixel electrodes on the array substrate and the common electrode layer which is arranged oppositely on the opposing substrate. The TN-type display device has the advantage of large aperture ratio.

At least one embodiment of the present disclosure provides an array substrate, which comprises: a base substrate and a plurality of data signal lines, a plurality of first scanning signal lines which are insulated from each other and intersected with the plurality of data signal lines, a plurality of second scanning signal lines which are insulated from each other and intersected with the plurality of data signal lines, a plurality of first switching elements, and a plurality of second switching elements, which are disposed on the base substrate; the plurality of data signal lines and the plurality of first scanning signal lines are intersected with each other to define a plurality of sub-pixels which are arranged in an array; each sub-pixel includes a pixel electrode; one second scanning signal line is disposed at a position corresponding to the (2N+1)th row of sub-pixels or the (2N+2)th row of sub-pixels, or one second scanning signal line is disposed at a position corresponding to the (N+1)th row of sub-pixels, in which N is an integer greater than or equal to zero; each first switching element is disposed in a corresponding sub-pixel and configured to control the on- and off-state of the corresponding sub-pixel; each second switching element is disposed in a corresponding sub-pixel group, configured to simultaneously control the on- and off-state of the sub-pixels in the corresponding sub-pixel group, and connected with the data signal line, the second scanning signal line and the plurality of pixel electrodes in the sub-pixel group provided with the second switching element; each first scanning signal line is configured to control a plurality of first switching elements in one row of sub-pixels; and each second scanning signal line is configured to control a plurality of second switching elements in one row of sub-pixel groups. In power-saving mode, scanning-off-signals are applied to the first scanning signal lines; scanning-on-signals are applied to the second scanning signal lines; and data signals are applied to the data signal lines connected with the second switching elements. Thus, the number of the scanning signal lines and/or the data signal lines applied with signals can be reduced by half. Therefore, the resolution of the display device under full-screen display can be reduced by half and even reduced by three quarters, and hence the driving power consumption of the display panel can be reduced but the display brightness cannot be affected.

It should be noted that:

(1) In the embodiments of the present disclosure and the accompanying drawings thereof, Gx−1, Gx, Gx+1, Gx+2 and Gx+3 refer to adjacent first scanning signal lines, and Dz−1, Dz, Dz+1, Dz+2 and Dz+3 refer to adjacent data signal lines. The embodiments of the present disclosure and the accompanying drawings thereof only illustrate the structures involved in the embodiments of the present disclosure. Other structures, for instance, the common electrodes, common electrode lines and the like in the LCD device, an organic OLED functional layer in the OLED display device, and the like may refer to the conventional design.

(2) In the embodiments of the present disclosure, each second TFT includes the gate electrode, the active layer, the source electrode and the drain electrode. When the drain electrode includes the first drain electrode and the second drain electrode, both the first drain electrode and the second drain electrode are connected with the active layer. For instance, the active layer may be "Y"-shaped so as to be connected with both the first drain electrode and the second drain electrode. But the present disclosure is not limited thereto, as long as the shape of the active layer allows both the first drain electrode and the second drain electrode to be connected with the active layer. No limitation will be given here.

(3) In the embodiments of the present disclosure, the source electrode and the drain electrode are a relative concept and can be exchanged as required in actual use.

(4) In the embodiments of the present disclosure, "N is an integer greater than or equal to zero" refers to that N is selected from one or more in a set formed by 0 and positive integers, and "M is an integer greater than or equal to zero" refers to that M is selected from one or more in a set formed by 0 and positive integers. In the embodiments of the present disclosure, both N and M may be selected as above.

(5) The layer structures in the array substrate provided by the embodiments of the present disclosure may be formed by a conventional method.

(6) The embodiments of the present disclosure and the features in the embodiments may be mutually combined if there is no conflict.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The application claims priority to the Chinese patent application No. 201510355348.7, filed Jun. 24, 2015, the disclosure of which is incorporated herein by reference as part of the application.

What is claimed is:

1. An array substrate, comprising: a base substrate and a plurality of data signal lines, a plurality of first scanning signal lines which are insulated from each other and intersected with the plurality of data signal lines, a plurality of second scanning signal lines which are insulated from each other and intersected with the plurality of data signal lines, wherein the plurality of data signal lines and the plurality of first scanning signal lines are intersected with each other to define a plurality of sub-pixels which are arranged in an array; each sub-pixel includes a pixel electrode;

one second scanning signal line is disposed at a position corresponding to the (2N+1)th row of sub-pixels or the (2N+2)th row of sub-pixels, or one second scanning signal line is disposed at a position corresponding to the (N+1)th row of sub-pixels, in which N is an integer greater than or equal to zero;

each of the sub-pixels is provided with a first switching element configured to control an on- and off-state of the corresponding sub-pixel;

the array substrate further comprises a second switching element disposed on the base substrate, the plurality of sub-pixels includes a plurality of first sub-pixels constituting a sub-pixel group, the pixel electrode of each of the first sub-pixels is connected with the second switching element configured to simultaneously control an on- and off-state of the first sub-pixels, the second switching element and the first switching element of at least one of the first sub-pixels are directly connected with a same data signal line, and the second switching element is connected with one of the second scanning signal lines;

each first scanning signal line is configured to control a plurality of first switching elements in one row of sub-pixels; and each second scanning signal line is configured to control a plurality of second switching elements in one row of sub-pixel groups.

2. The array substrate according to claim 1, wherein in a case where one second scanning signal line is disposed at the position corresponding to the (2N+1)th row of sub-pixels or the (2N+2)th row of sub-pixels, one sub-pixel group includes two sub-pixels which respectively belong to the (M+1)th column and are disposed in the (2N+1)th row and the (2N+2)th row of sub-pixels or four sub-pixels which respectively belong to the (2M+1)th column and the (2M+2)th column and are disposed in the (2N+1)th row and the (2N+2)th row of sub-pixels, in which M is an integer greater than or equal to zero.

3. The array substrate according to claim 2, wherein the first switching element includes one first thin-film transistor (TFT); and the second switching element includes one or more second TFTs.

4. The array substrate according to claim 3, wherein as for the sub-pixel group, in each column of sub-pixels, one second TFT is disposed in the (2N+1)th row of sub-pixels or the (2N+2)th row of sub-pixels;

the second TFT includes a first drain electrode and a second drain electrode which are spaced from each other and respectively connected with the pixel electrode of the (2N+1)th row of sub-pixels and the pixel electrode of the (2N+2)th row of sub-pixels; a source electrode of the second TFT is connected with one of the data signal lines; and a gate electrode of the second TFT is connected with the second scanning signal line which is disposed at the position corresponding to the (2N+1)th row of sub-pixels or the (2N+2)th row of sub-pixels.

5. The array substrate according to claim 4, wherein the pixel electrode of the (2N+1)th row of sub-pixels or the pixel electrode of the (2N+2)th row of sub-pixels is provided with a connecting portion which is connected with the second TFT or provided with a connecting electrode which is configured to connect the second TFT and the pixel electrode of the (2N+1)th row of sub-pixels or the (2N+2)th row of sub-pixels.

6. The array substrate according to claim 3, wherein as for the sub-pixel group, in each column of sub-pixels, two second TFTs are disposed in the (2N+1)th row of sub-pixels or the (2N+2)th row of sub-pixels;

both gate electrodes of the two second TFTs are connected with the second scanning signal line which is disposed at the position corresponding to the (2N+1)th row of sub-pixels or the (2N+2)th row of sub-pixels; both source electrodes of the two second TFTs are connected with the same data signal line; and drain electrodes of the two second TFTs are respectively connected with the pixel electrode of the (2N+1)th row of sub-pixels and the pixel electrode of the (2N+2)th row of sub-pixels.

7. The array substrate according to claim 6, wherein in the sub-pixel group, the pixel electrode away from the second scanning signal line is provided with a connecting portion which is connected with the second TFT, or provided with a connecting electrode which is configured to connect one of the second TFTs and the pixel electrode away from the second scanning signal line.

8. The array substrate according to claim 3, wherein as for the sub-pixel group, in each column of sub-pixels, the plurality of second TFTs which are configured to simultaneously control an on- and off-state of the sub-pixels in the (2N+1)th row of sub-pixels and the (2N+2)th row of sub-pixels are provided with the same gate electrode.

9. The array substrate according to claim 3, wherein in the sub-pixel group, source electrodes of a plurality of second TFTs in each column of sub-pixels are all connected with the data signal line for defining the column of sub-pixels on a same side.

10. The array substrate according to claim 3, wherein in the sub-pixel group, source electrodes of the second TFTs in the (2M+1)th column and the (2M+2)th column of sub-pixels are all connected with the data signal line disposed between the two columns of sub-pixels.

11. The array substrate according to claim 1, wherein in a case where one second scanning signal line is disposed at the position corresponding to the (2N+1)th row of sub-pixels or the (2N+2)th row of sub-pixels, a projection of the second scanning signal line on the base substrate is disposed at a position between projections of the pixel electrode of the (2N+1)th row of sub-pixels and the pixel electrode of the (2N+2)th row of sub-pixels on the base substrate.

12. The array substrate according to claim 3, wherein the first TFT is an N-type TFT or a P-type TFT; and the second TFT is an N-type TFT or a P-type TFT.

13. The array substrate according to claim 3, wherein the pixel electrode of the sub-pixel is connected with the first scanning signal line and the data signal line through one first TFT.

14. An array substrate, comprising: a base substrate and a plurality of data signal lines, a plurality of first scanning signal lines which are insulated from each other and intersected with the plurality of data signal lines, a plurality of second scanning signal lines which are insulated from each other and intersected with the plurality of data signal lines, wherein
the plurality of data signal lines and the plurality of first scanning signal lines are intersected with each other to define a plurality of sub-pixels which are arranged in an array; each sub-pixel includes a pixel electrode;
one second scanning signal line is disposed at a position corresponding to the (2N+1)th row of sub-pixels or the (2N+2)th row of sub-pixels, or one second scanning signal line is disposed at a position corresponding to the (N+1)th row of sub-pixels, in which N is an integer greater than or equal to zero;
each of the sub-pixels is provided with a first switching element configured to control an on- and off-state of the corresponding sub-pixel;
the array substrate further comprises a second switching element disposed on the base substrate, the plurality of sub-pixels includes a plurality of first sub-pixels constituting a sub-pixel group, the pixel electrode of each of the first sub-pixels is connected with the second switching element configured to simultaneously control an on- and off-state of the first sub-pixels, and the second switching element is connected with one data signal line and one of the second scanning signal lines;
each first scanning signal line is configured to control a plurality of first switching elements in one row of sub-pixels; and each second scanning signal line is configured to control a plurality of second switching elements in one row of sub-pixel groups, and
in a case where one of the second scanning signal lines is disposed at a position corresponding to the (N+1)th row of sub-pixels, one sub-pixel group includes two sub-pixels which respectively belong to the (N+1)th row and are disposed in the (2M+1)th column and the (2M+2)th column of sub-pixels, in which M is an integer greater than or equal to zero.

15. The array substrate according to claim 14, wherein the first switching element includes one first TFT; and each second switching element includes one or more second TFTs.

16. The array substrate according to claim 15, wherein in the sub-pixel group, one second TFT is disposed in the (2M+1)th column of sub-pixels or the (2M+2)th column of sub-pixels;
the second TFT includes a first drain electrode and a second drain electrode which are spaced form each other and respectively connected with the pixel electrode of the sub-pixel in the (2M+1)th column of sub-pixels and the pixel electrode of the (2M+2)th column of sub-pixels; a source electrode of the second TFT is connected with the data signal line between the (2M+1)th column of sub-pixels and the (2M+2)th column of sub-pixels; and a gate electrode of the second TFT is connected with the second scanning signal which is disposed at the position corresponding to the (N+1)th row of sub-pixels.

17. The array substrate according to claim 16, wherein the first drain electrode is connected with the pixel electrode of the sub-pixel in the (2M+1)th column of sub-pixels; the second drain electrode is connected with a connecting electrode which is connected with a connecting line; and the connecting line is connected with the (2M+2)th column of sub-pixels.

18. A display device, comprising the array substrate according to claim 14.

19. A method for driving an array substrate, the array substrate comprising: a base substrate and a plurality of data signal lines, a plurality of first scanning signal lines which are insulated from each other and intersected with the plurality of data signal lines, a plurality of second scanning signal lines which are insulated from each other and intersected with the plurality of data signal lines, wherein
the plurality of data signal lines and the plurality of first scanning signal lines are intersected with each other to define a plurality of sub-pixels which are arranged in an array; each sub-pixel includes a pixel electrode;
one second scanning signal line is disposed at a position corresponding to the (2N+1)th row of sub-pixels or the (2N+2)th row of sub-pixels, or one second scanning signal line is disposed at a position corresponding to the (N+1)th row of sub-pixels, in which N is an integer greater than or equal to zero;
each of the sub-pixels is provided with a first switching element configured to control an on- and off-state of the corresponding sub-pixel;
the array substrate further comprises a second switching element disposed on the base substrate, the plurality of sub-pixels includes a plurality of first sub-pixels constituting a sub-pixel group, the pixel electrode of each of the first sub-pixels is connected with the second switching element configured to simultaneously control an on- and off-state of the first sub-pixels, and the second switching element is connected with one data signal line and one of the second scanning signal lines;
each first scanning signal line is configured to control a plurality of first switching elements in one row of sub-pixels; and each second scanning signal line is configured to control a plurality of second switching elements in one row of sub-pixel groups, and in a case where one of the second scanning signal lines is disposed at a position corresponding to the (N+1)th row of sub-pixels, one sub-pixel group includes two sub-pixels which respectively belong to the (N+1)th row and are disposed in the (2M+1)th column and the (2M+2)th column of sub-pixels, in which M is an integer greater than or equal to zero;

the first switching element includes one first TFT; and the second switching element includes one or more second TFTs;

the method comprising:

in a first mode, applying scanning-on-signals over the first scanning signal lines and applying scanning-off-signals over the second scanning signal lines; and in a second mode, applying scanning-off-signals over the first scanning signal lines, applying scanning-on-signals over the second scanning signal lines, and applying data signals over the data signal lines connected with the second switching elements;

wherein in a case where the first TFT is an N-type TFT and the second TFT is a P-type TFT, in the first mode, high-level signals are applied to the first scanning signal lines; and in the second mode, low-level signals are applied to the second scanning signal lines.

* * * * *